United States Patent [19]
Motai

[11] Patent Number: 5,368,805
[45] Date of Patent: Nov. 29, 1994

[54] METHOD FOR PRODUCING RESIN SEALED TYPE SEMICONDUCTOR DEVICE

[75] Inventor: Kenji Motai, Kawasaki, Japan

[73] Assignee: Fuji Electric Co., Ltd., Kanagawa, Japan

[21] Appl. No.: 35,781

[22] Filed: Mar. 23, 1993

[30] Foreign Application Priority Data

Mar. 24, 1992 [JP] Japan .................. 4-065408
Dec. 8, 1992 [JP] Japan .................. 4-327077

[51] Int. Cl.5 .................. B29C 45/14; B29C 45/73
[52] U.S. Cl. .................. 264/272.15; 264/272.17; 264/327; 264/328.12; 264/328.16
[58] Field of Search .......... 264/272.17, 328.12, 264/328.16, 327, 272.15

[56] References Cited

U.S. PATENT DOCUMENTS

| | | | |
|---|---|---|---|
| 4,173,821 | 11/1979 | Yamamoto et al. | 264/272.17 |
| 4,784,814 | 11/1988 | Diethelm et al. | 264/327 |
| 4,927,580 | 5/1990 | Nasu et al. | 264/102 |

FOREIGN PATENT DOCUMENTS

| | | | |
|---|---|---|---|
| 55-120153 | 9/1980 | Japan | 264/272.17 |
| 60-113930 | 6/1985 | Japan . | |
| 62-16533 | 1/1987 | Japan | 264/272.17 |
| 62-39215 | 2/1987 | Japan . | |
| 63-99539 | 4/1988 | Japan | 264/272.17 |
| 2-290032A | 11/1990 | Japan . | |
| 3-94432A | 6/1991 | Japan . | |
| 3129839 | 6/1991 | Japan | 264/272.17 |
| 4163114 | 6/1992 | Japan . | |
| 4255236 | 9/1992 | Japan . | |

*Primary Examiner*—Jan H. Silbaugh
*Assistant Examiner*—Angela Ortiz
*Attorney, Agent, or Firm*—Spencer, Frank & Schneider

[57] ABSTRACT

An assembly is provided with a semiconductor chip mounted on the main surface side of a die pad of a lead frame. The semiconductor chip is connected with a lead via bonding wire. The assembly is inserted into a transfer molding die for resin sealing, wherein the die temperature of a lower die is set higher than the die temperature of an upper die, and the transfer molding is carried out. Specifically, the die surface temperature of the lower die disposed at the main surface side of the lead frame is set higher by +5° to +15° C. than the die surface temperature (170° C.) of the upper die disposed at the rear surface side to carry out molding. This reduces the viscosity of the sealing resin flowing into the rear surface side to increase fluidity of the resin, and a thin resin layer can be positively molded without insufficient resin filling at the rear surface side where the flow path cross sectional area in the cavity is small.

4 Claims, 3 Drawing Sheets

METHOD FOR PRODUCING RESIN SEALED TYPE SEMICONDUCTOR DEVICE

BACKGROUND OF THE INVENTION

1. Field of the Invention

The present invention relates to a method for producing a resin sealed type semiconductor device.

2. Description of the Prior Art

FIG. 1 shows the structure of a resin sealed type semiconductor device, to which the present invention is to be applied, and FIG. 2 shows a circuit assembly composed of a semiconductor chip and a lead frame. Referring to the Figures, a lead frame 1 used for assembling the semiconductor device comprises a die pad 1a, which also functions as a heat sink, a lead 1b, and a semiconductor chip 2 which is mounted on the main surface side of the die pad 1a. The semiconductor chip 2 is connected with the lead 1b of the lead frame 1 through a bonding wire 3, thereby forming the circuit assembly shown in FIG. 2. The circuit assembly is molded, and resin sealed with a resin package 4. Such a semiconductor device is normally mounted on a heat sink 5 with the thermal transfer resistance between the die pad 1a and the heat sink 5 reduced to as low of a value as possible. The resin package 4 has a resin layer thickness d coating the rear surface side of the die pad 1a. Resin layer thickness d is extremely small compared to a resin layer on the main surface side and is, for example, formed to a thickness of approximately 0.5 mm.

Outer shapes of the package of a resin sealed type semiconductor device are standardized, for example, by the U.S. JEDEC (Joint Electron Device Engineering Council), and package outer shapes such as T0220, T03P, and the like are known. The present invention relates to an improvement of the production method for a resin sealed type semiconductor device, and particularly, is directed to a production method for resin sealed type semiconductor devices with package outer shapes having resin packages with portions of different resin layer thicknesses such as T0220, T03P, and the like.

Molding of the resin package 4 is generally achieved by transfer molding. In the transfer molding process, a lead frame assembly as is shown in FIG. 2 is preheated to a predetermined temperature. The lead is pinched between an upper die and a lower die of a molding die heated to a predetermined temperature. The die pad is inserted into a cavity formed between the upper and lower dies, and a sealing resin is injected through a gate of the molding die to achieve molding. Heretofore, when an epoxy type resin is used as a sealing resin, the surface temperature of the die is kept at 170° to 180° C. for molding.

When the resin package 4 as shown in FIG. 1 is molded using a transfer molding die, since a cross section between the die pad 1a and the cavity wall of the die at a rear surface side of the die pad 1a is extremely thin compared to the main surface side, resin flow at the rear surface side in the cavity is disturbed compared to the main surface side under the same molding pressure. Thus the sealing resin injected through the die gate tends to flow and fill the main surface side of the cavity earlier than the rear surface side. As a result, the filling of resin at the rear surface side of the die pad is insufficient, resulting in molding defects such as pinholes, weld marks, and the like.

FIG. 3 shows such a condition. Sealing resin is shown injected through a gate 8 at the left end of a molding die comprising an upper die 6 disposed at the main surface side of the die pad 1a and a lower die 7 disposed at the rear surface side. The sealing resin fills the main surface side in the cavity earlier where the flow path cross section is larger, and resin filling is delayed at the rear surface side in the cavity where the flow path cross section is small. Therefore, fusion of the resin does not occur between the sealing resin R flowing through in the rear surface side and the sealing resin R flowing through the main surface side to the rear surface side from an end at the right side, and defects such as weld marks, pinholes, and the like tend to be generated. Further, if the above-described defects such as weld marks, pinholes, and the like occur at the rear surface side of the die pad, strength of the resin package decreases, leading to breakage and cracking.

There are known methods such as disclosed in Japanese Patent Application Laying-open No. 290032/1990 and Japanese Patent Application Laying-open No. 94432/1991, in which a control member, such as an orifice, is provided at the die side or the lead frame side for slowing the flow of resin to the main surface side of the die pad in the cavity of a die so that sufficient sealing resin flows to the rear surface side of the die pad.

However, these methods require complex dies, resulting in an increase in cost and limitation in the applicable package outer shape.

SUMMARY OF THE INVENTION

With a view to eliminating such prior art problems, it is a primary object of the present invention to provide a method for producing a resin sealed type semiconductor device that is able to positively form a thin-walled sealing resin layer at a rear surface side of a lead frame without incorporating a special control member for changing the flow of resin in the die.

According to an aspect of the present invention, there is provided a method for producing a resin sealed type semiconductor device comprising the steps of:

inserting an assembly provided with a semiconductor chip mounted on the main surface side of a die pad of a lead frame, and wire-bonding between the semiconductor chip and the lead of a lead frame, into a cavity formed between an upper molding die and a lower molding die disposed in such a manner that the semiconductor chip faces to an inner wall of the upper die, wherein a temperature of the lower molding die is set to a higher value than that of the upper molding die; and injecting a sealing resin into the cavity by transfer molding a resin sealing, thereby molding a resin package.

The temperatures of the upper and lower dies may be controlled through the surface temperatures thereof, respectively.

The surface temperature of the lower molding die may be set to a temperature $+5°$ to $+15°$ C. higher than the surface temperature of the upper molding die.

The surface temperature of the upper molding die may be set to 170° to 180° C., and the surface temperature of the lower molding die may be set to 175° to 195° C.

The surface temperature of the upper molding die may be set to $170°\pm 3°$ C., and the surface temperature of the lower molding die may be set to $175°\pm 3°$ C. to $185°\pm 3°$ C.

The sealing resin may be an epoxy type resin.

In the above method, the sealing resin (e.g. an epoxy type resin) is injected through the gate of the transfer molding die into the cavity formed between the upper molding die and lower molding die.

The lead frame is inserted into the cavity. The resin is divided at the lead frame to the lead frame's main surface side and rear surface side. The temperature of the lower die, which corresponds to a narrow portion at the rear surface side of the die pad, can be set higher than the temperature of the upper die, which corresponds to a broad portion at the main surface side. Thus, the sealing resin flowing in the rear surface side of the die pad is decreased in viscosity and increased in fluidity compared to the resin flowing at the main surface side. This allows the sealing resin to fill all corners of the narrow portion at the rear surface side earlier than the broad portion at the main surface side.

Further, due to the higher molding temperature, curing of the resin at the narrow portion advances faster, thereby positively forming a thin sealing resin layer at the rear surface side of the die pad with no molding defects.

Additionally, the surface temperature of the lower molding die can be +5° to +15° C. higher than the surface temperature of the upper molding die. Thus, the sealing resin flowing into the rear surface side of the die pad is decreased in viscosity and increased in fluidity compared to the resin flowing at the main surface side. This allows the sealing resin to fill the rear surface side earlier than the main surface side, thereby preventing defects such as weld marks and pinholes in the narrow portion at the rear surface side of the die pad.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
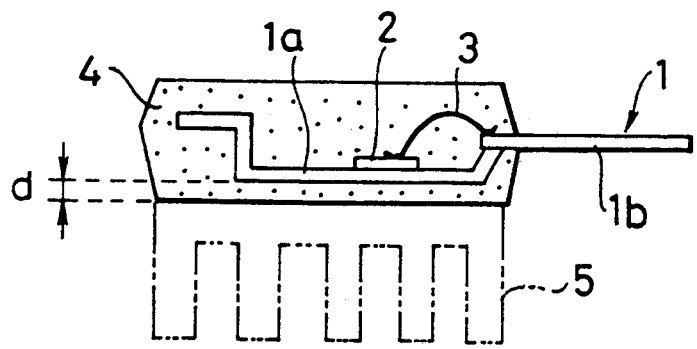
FIG. 1 is a schematic cross sectional view of a resin sealed type semiconductor device to which the present invention is applicable.
Figure 2:
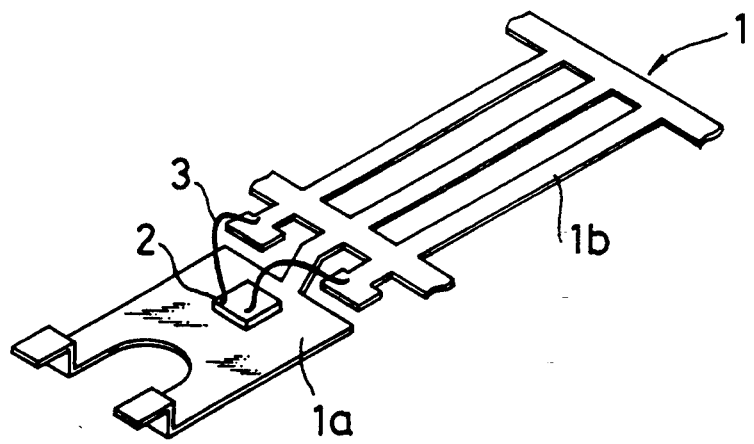
FIG. 2 is a schematic perspective view of the lead frame assembly shown in FIG. 1.
Figure 3:
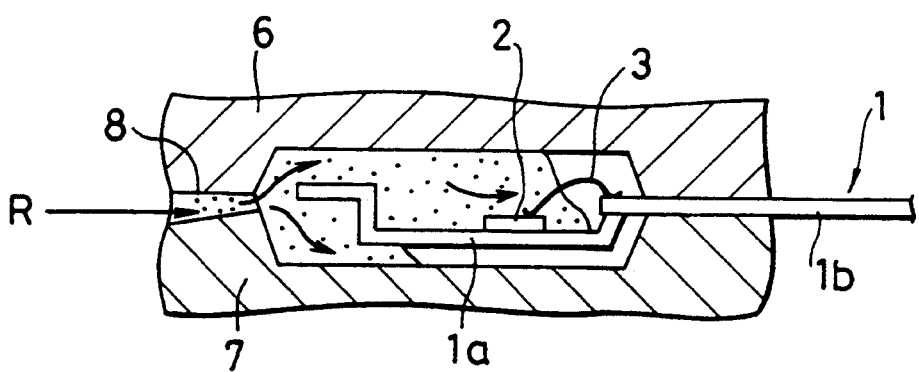
FIG. 3 is a schematic cross sectional view showing the flow condition of a sealing resin in a die by a prior art molding method.
Figure 4:
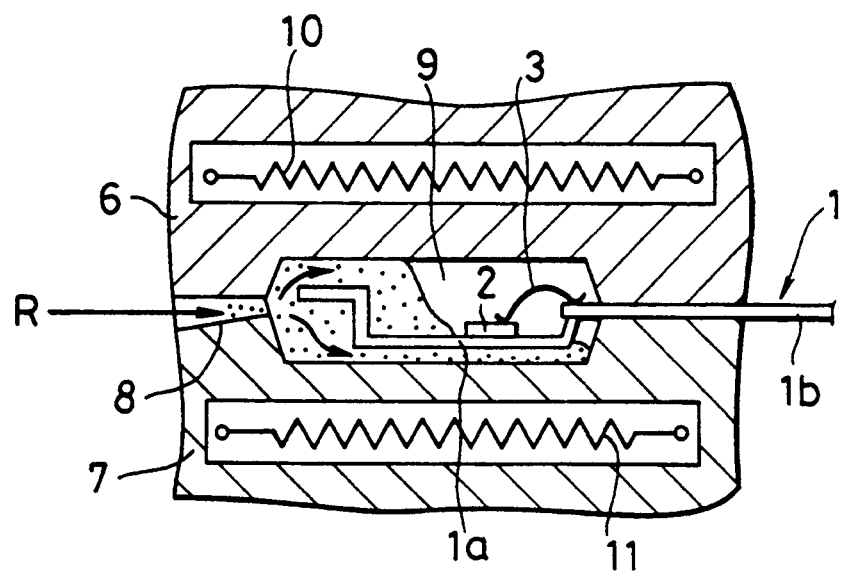
FIG. 4 is a schematic cross sectional view showing the flow condition of a sealing resin in a die in an embodiment of the resin sealing process of the resin sealed type semiconductor device according to the present invention.

FIG. 4 is a schematic cross sectional view showing the inside of a die in a resin sealing process of a semiconductor device by a transfer molding method according to an embodiment of the present invention. Similar components to those used in FIG. 1 and FIG. 2 are indicated by similar symbols, and detailed descriptions thereof are omitted.

FIG. 4 illustrates a circuit assembly which comprises a semiconductor chip 2 disposed at the main surface side of a die pad 1a of a lead frame 1. Semiconductor chip 2 is connected with a lead 1b of lead frame 1 via a bonding wire 3, and is disposed in a transfer molding die for molding and resin sealing a resin package 4. The transfer molding die comprises an upper die 6 and a lower die 7, which are put together to form a gate 8 and a cavity 9. Gate 8 allows the sealing resin R to be injected into cavity 9 for forming the outer shape of the resin package 4. The upper die 6 and the lower die 7 are individually and independently heated by heaters 10 and 11, respectively. As shown, the heaters 10 and 11 of the present embodiment are individually built in the upper die 6 and the lower die 7, and controlled according to a signal from sensors, such as thermocouples (not shown), embedded in the upper die 6 and the lower die 7, respectively.

To carry out resin sealing using the transfer molding die of the above arrangement, the die pad 1a is inserted into the cavity 9 of the molding die in such a manner that the main surface of the die pad 1a, on which the semiconductor chip 2 is mounted, faces upward. Then, an epoxy type sealing resin (e.g. Nitto Denko MP-4000 Series, Shin-Etsu Chemical KMC-120 Series, etc.) is injected under the pressure into the cavity 9 through the gate 8 to mold the resin package 4 shown in FIG. 1.

In the molding process, the heating temperatures of the heaters 10 and 11 are previously adjusted so that the die temperature of the upper die 6 is set to 170°±3° C. to 180°±3° C., and the die temperature of the lower die 7 is set 10° C. higher than that of the upper die between 180°±3° C. to 190°±3° C., and molding is carried out. The temperature of the lower die is selected according to the type of sealing resin R. The sealing resin R is divided into two flows from the date 8. The sealing resin R flowing into the rear surface side of the lead frame 1 is reduced in viscosity and increased in fluidity compared to the sealing resin R flowing at the main surface side. Therefore, all corners of a narrow region at the rear surface side is filled with the sealing resin R earlier than a broad region at the main surface side of the die pad 1a. Further, since the injected resin in the narrow region has a relatively thin resin layer thickness and a relatively high molding temperature, curing of the resin occurs quickly, which prevents the generation of defects, such as the insufficient filling of the narrow portion at the rear surface side. Thus, the resin package 4 shown in FIG. 1 is securely molded.

In the above-described example, the die temperatures are controlled according to signals from sensors (not shown) embedded in the upper die 6 and the lower die 7. Alternatively, sensors can be provided which are capable of measuring and controlling the surface temperatures of the upper die 6 and the lower die 7, thereby achieving molding more securely. Such an embodiment will be described below.

Figure 5:
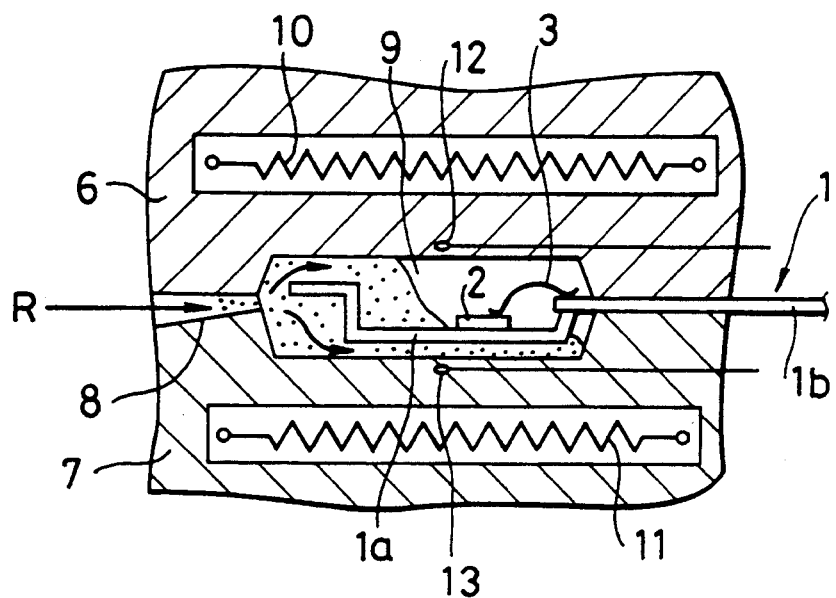
FIG. 5 is a schematic cross sectional view showing the flow condition of a sealing resin in a die in another embodiment of the resin sealing process of the resin sealed type semiconductor device according to the present invention.

FIG. 5 is a schematic cross sectional view showing the inside of the die in a resin sealing process of the semiconductor device according to the present embodiment. In this embodiment, sensors 12 and 13 are incorporated in portions of the upper die 6 and lower die 7 close to the cavity 9. Sensors 12 and 13 measure surface temperatures of the upper die 6 and the lower die 7, respectively. The heaters 10 and 11 are individually and independently controlled according to the surface temperatures measured by the sensors 12 and 13, respectively. An example of resin sealing using the aforementioned die is as follows:

First, heating temperatures of the heaters 10 and 11 are controlled so that the die temperature of the upper die 6 is previously set to 170°±3° C. to 180°±3° C. and the surface temperature of the lower die 7 is set +5° to +15° C. higher than the surface temperature of the upper die, to between 175°±3° C. to 195°±3° C., and molding is carried out. Casting resin flowing into the cavity 9 is divided at the lead frame 1 into two flows. One flow goes to the main surface (upper surface) side and the other flow goes to the rear surface (lower surface) side of the die pad 1a. In this case, by setting the surface temperature difference between the upper die 6 and the lower die 7 to the above condition, the sealing resin R flowing into the rear surface side is decreased in viscosity and increased in fluidity compared to the sealing resin R flowing into the main surface side. Therefore, the corners of the narrow portion at the rear surface side of the die pad 1a are filled with the resin earlier than the broad portion at the main surface side, and generation of defects, such as weld marks and pinholes, in the rear surface side of the die pad is suppressed. Thus, a resin package with no defects is obtained.

Figure 6:
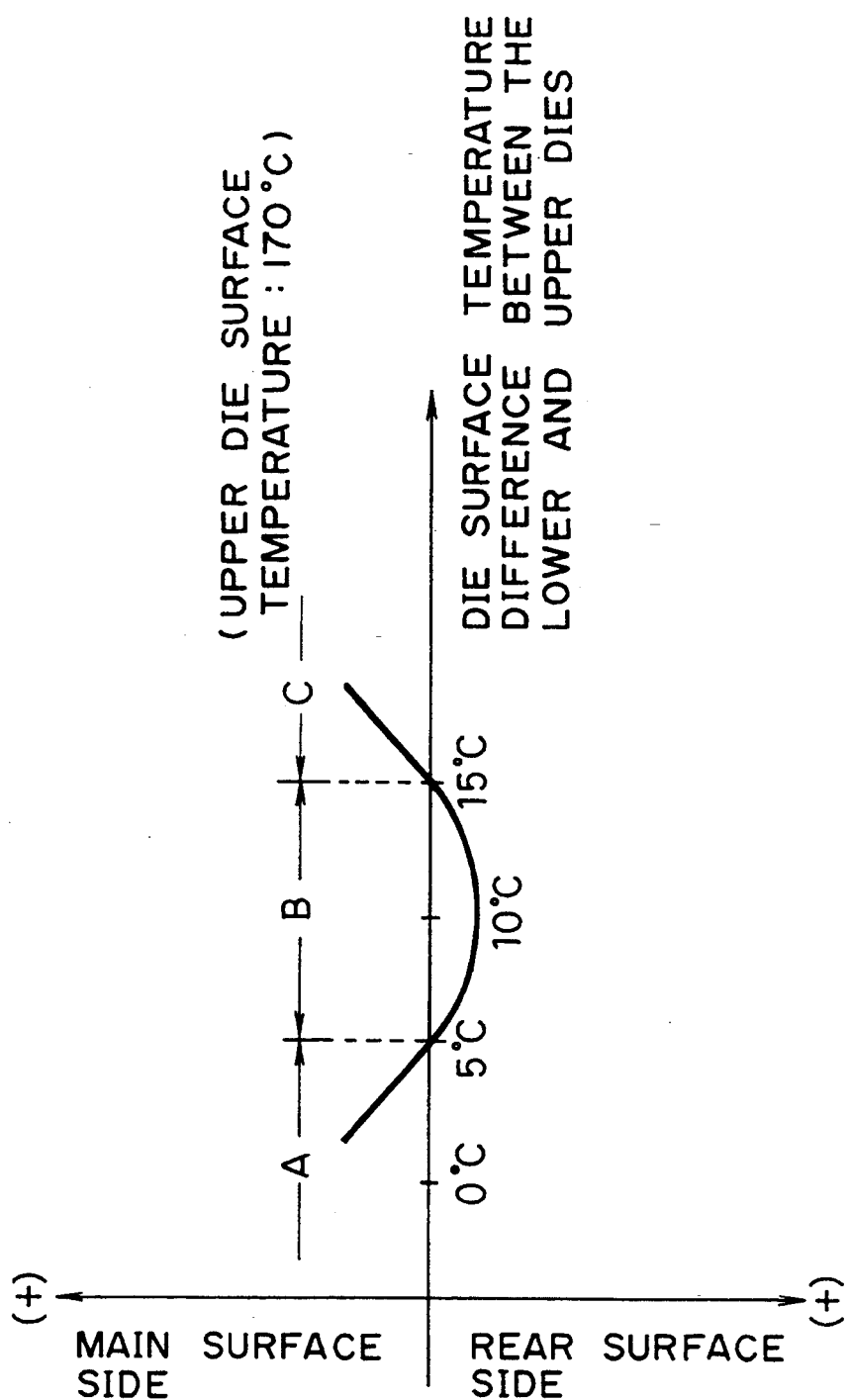
FIG. 6 is a characteristic diagram showing the relationship between a die surface temperature difference of an upper die and a lower die and a sealing resin filling speed.

FIG. 6 shows a graphical representation of experimental results of the relationship between the die surface temperature difference of an upper die and a lower die, and the sealing resin filling speed, where the surface temperature of the lower die 6 is set to 170°±3° C., and the surface temperature of the lower die 7 is varied. In FIG. 6, the abscissa indicates a difference in surface temperature between the upper die and the lower die, and the ordinate indicates a relative filling speed of the sealing resin flowing at the main surface side and the rear surface side separated at the die pad 1a. As can be seen from FIG. 6, in a region A where the surface temperature difference of the die is +5° C. or less, fluidities of the sealing resin R separately flowing at the main surface side and the rear surface side are nearly the same and, since the flow path cross sectional area is smaller at the rear surface side, the main surface side is filled relatively earlier. On the other hand, in a region B where the surface temperature difference of the die is adjusted to +5° C. to +15° C., the sealing resin R flowing into the lower surface side is decreased in viscosity and increased in fluidity, and the rear surface side is filled relatively earlier with the sealing resins R. Therefore, in this case, defects such as weld marks and pinholes are not generated at the rear surface side of the die pad. On the other hand, in a region C where the surface temperature difference of the die is greater than +15° C., since the surface temperature of the lower die 7 is too high, curing of the resin rapidly advances and the viscosity is increased. As a result, defects such as weld marks and pinholes tend to be generated as in the region A.

As described above, with the production method according to the present invention, a resin package with no defects, such as insufficient filling at the narrow portion side of the resin layer, can be positively molded merely by independently setting the die temperatures of the upper die and the lower die so that the die temperature is higher at the rear surface side of the lead frame than at the main surface side. Thus, a specific resin flow control member within the cavity of the transfer molding die, or in the lead frame assembly is not necessary.

Specifically, the die surface temperatures of the upper die and the lower die can be independently adjusted to prevent generation of molding defects, such as weld marks and pinholes, due to insufficient resin filling at the rear surface side of the lead frame, where the resin layer is think, whereby a high-quality resin package is molded.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A method for producing a resin sealed semiconductor device using a transfer molding process in a die, the die having a lower molding die portion and an upper molding die portion relative to the lower molding die portion, the semiconductor device having a lead frame assembly provided with a semiconductor chip mounted on a main surface side of a die pad of a lead frame and connected with a lead of the lead frame through a bonding wire, comprising the steps of:

heating said die to maintain a surface temperature of the lower molding die portion by about 5° C. to about 15° C. higher than a surface temperature of the upper molding die portion;

inserting the lead frame assembly into a cavity formed between the heated upper and lower molding die portions whereby the semiconductor chip is positioned to face an inner wall of the upper molding die portion and whereby the die pad forms an upper and lower path for a sealing resin, said upper path being between the inner wall of the upper molding die portion and the main surface side of the die pad, said lower path being between an inner wall of the lower molding die portion and a rear surface side of the die pad, said lower path being thinner than said upper path; and injecting said sealing resin into said cavity by transfer molding for resin sealing, the sealing resin flowing on the rear surface side of the die pad being reduced in viscosity and increased in fluidity relative to the sealing resin flowing on the main surface side of the die pad, whereby a substantially defect free resin package is molded having a resin layer formed on the rear surface side of the die pad that is thinner than a resin layer formed on the main surface side.

2. The method as claimed in claim 1, wherein said sealing resin is an epoxy resin.

3. A method according to in claim 1, wherein said surface temperature of the upper molding die portion is in the range from about 170° C. to about 180° C., and said surface temperature of the lower molding die portion is in the range from about 175° C. to about 195° C.

4. A method according to claim 1, wherein said surface temperature of the upper molding die portion is about 170°±3° C., and said surface temperature of the lower molding die portion is in the range from about 175°±3° C. to about 185°±3° C.

* * * * *